(12) United States Patent
Blanken

(10) Patent No.: US 8,035,362 B2
(45) Date of Patent: Oct. 11, 2011

(54) AMPLIFIER SYSTEM WITH DC-COMPONENT CONTROL

(75) Inventor: Pieter G. Blanken, Nuenen (NL)

(73) Assignee: NXP B.V., Eindhoven (NL)

( * ) Notice: Subject to any disclaimer, the term of this patent is extended or adjusted under 35 U.S.C. 154(b) by 681 days.

(21) Appl. No.: 11/911,699

(22) PCT Filed: Apr. 12, 2006

(86) PCT No.: PCT/IB2006/051134
§ 371 (c)(1),
(2), (4) Date: Jun. 2, 2008

(87) PCT Pub. No.: WO2006/111891
PCT Pub. Date: Oct. 26, 2006

(65) Prior Publication Data
US 2008/0252380 A1 Oct. 16, 2008

(30) Foreign Application Priority Data

Apr. 20, 2005 (EP) .................................. 05300299
Aug. 29, 2005 (EP) .................................. 05300699

(51) Int. Cl.
*G05F 1/00* (2006.01)
*H03F 3/04* (2006.01)

(52) U.S. Cl. .................. 323/273; 323/280; 330/297

(58) Field of Classification Search .......... 323/273, 323/280, 268, 271; 330/297
See application file for complete search history.

(56) References Cited

U.S. PATENT DOCUMENTS

| | | | |
|---|---|---|---|
| 3,774,069 A * | 11/1973 | Yasumatsuya | 315/403 |
| 3,909,701 A | 9/1975 | Waehner et al. | |
| 4,346,349 A * | 8/1982 | Yokoyama | 330/10 |
| 4,516,080 A * | 5/1985 | Garde | 330/3 |
| 4,721,922 A | 1/1988 | Redfern et al. | |
| 4,982,307 A * | 1/1991 | Patel | 361/103 |
| 5,831,477 A * | 11/1998 | Tsumura | 330/51 |
| 5,905,407 A | 5/1999 | Midya et al. | |
| 6,064,187 A * | 5/2000 | Redl et al. | 323/285 |
| 6,130,525 A | 10/2000 | Jung et al. | |
| 6,130,526 A | 10/2000 | Yang et al. | |
| 6,411,240 B1 * | 6/2002 | Greitschus | 341/155 |
| 6,583,664 B2 | 6/2003 | Mathe et al. | |
| 6,590,940 B1 | 7/2003 | Camp, Jr. et al. | |
| 6,661,210 B2 | 12/2003 | Kimball et al. | |
| 6,696,902 B2 * | 2/2004 | Lerke et al. | 333/25 |
| 6,710,646 B1 | 3/2004 | Kimball | |
| 6,747,510 B2 * | 6/2004 | Jantzi et al. | 330/51 |
| 6,958,593 B2 * | 10/2005 | Asanuma et al. | 323/282 |
| 7,053,505 B2 * | 5/2006 | Tsuruya | 307/105 |
| 7,292,015 B2 * | 11/2007 | Oswald et al. | 323/268 |
| 2003/0160658 A1 * | 8/2003 | Cioffi et al. | 330/297 |
| 2004/0051508 A1 * | 3/2004 | Hamon et al. | 323/280 |
| 2004/0164800 A1 | 8/2004 | Joffe | |

* cited by examiner

*Primary Examiner* — Adolf Berhane
*Assistant Examiner* — Emily Pham

(57) ABSTRACT

A power supply system comprises a parallel arrangement of a linear amplifier (LA) and a DC-DC converter (CO). An output of the linear amplifier (LA) is directly coupled to a load (LO) for supplying a first current (I1) to the load (LO). The DC-DC converter (CO) has a converter output coupled to the load (LO) for supplying a second current (12) to the load (LO). The linear amplifier (LA) comprises a first amplifier stage (OS1) to supply the first current (I1), and the second amplifier stage (OS2) to generate a third current (13) being proportional to the first current (I1). The first amplifier stage (OS1) and the second amplifier stage (OS2) have matched components. The DC-DC converter (CO) further comprises a controller (CON) having a control input for receiving a voltage generated by the third current (13) to control the second current (12) for minimizing a DC-component of the first current (I1).

16 Claims, 6 Drawing Sheets

AMPLIFIER SYSTEM WITH DC-COMPONENT CONTROL

FIELD OF THE INVENTION

The invention relates to a power supply system which comprises a parallel arrangement of a linear amplifier and a DC-DC converter, and an apparatus comprising such a power supply system.

BACKGROUND OF THE INVENTION

U.S. Pat. No. 5,905,407 discloses a high efficiency power amplifier using combined linear and switching techniques with a feedback system. A linear amplifier supplies an output current to a load via a sense resistor. A switching amplifier which comprises a controllable switch and two LC-sections is used as a DC-DC converter and supplies a further output current to the load. The resistor is arranged between the output of the linear amplifier and the output node of the power supply system at which the output voltage is present across the load. The output current of the linear amplifier flows through this resistor. The voltage across the resistor is used to control the DC-DC converter to obtain a minimal DC-component of the output current of the linear amplifier. Preferably, this minimal DC component is zero.

This parallel arrangement of a linear amplifier and a DC-DC converter is applied in a radio transmitter. The parallel arrangement is further also referred to as a power supply system. The radio transmitter comprises a power supply reference generator which supplies a reference signal to the linear amplifier to generate the system output voltage which tracks the reference signal. The radio transmitter further comprises a radio frequency (further referred to as RF) power amplifier for amplifying an RF signal. The RF amplifier is coupled to the output node to receive the system output voltage as a supply voltage. The reference signal is modulated to follow an amplitude modulation of the input signal of the RF amplifier. Thus, the supply voltage of the RF amplifier is controlled to meet the needs of the RF power amplifier to improve the efficiency of the RF amplifier.

The relatively slow DC-DC converter supplies the DC and low frequent currents to the load at a relatively high power efficiency, and the relatively low power efficiency linear amplifier supplies only the high frequent currents to the load.

The prior art resistor arranged between the linear amplifier and the output node has the drawback that it decreases the efficiency of the power supply system.

SUMMARY OF THE INVENTION

It is an object of the invention to improve the efficiency of a power supply system which comprises a linear amplifier arranged in parallel with a DC-DC converter.

A first aspect of the invention provides a power supply system as claimed in claim 1. A second aspect of the invention provides an apparatus as claimed in claim 15. Advantageous embodiments are defined in the dependent claims.

A power supply system in accordance with the first aspect of the invention comprises a parallel arrangement of a linear amplifier and a DC-DC converter. The linear amplifier has an output which is directly coupled to the load to supply a first current to the load. Thus now, no resistor is arranged between the output of the linear amplifier and the load. The output of the amplifier is also referred to as the amplifier output. The DC-DC converter has an output which is coupled to the load to supply a second current to the load. The output of the DC-DC converter is also referred to as the converter output.

The linear amplifier comprises a first amplifier stage to supply the first current, and a second amplifier stage to supply a third current which is proportional to the first current. The third current is thus identical to or a scaled copy of the first current. The first amplifier stage and the second amplifier stage have matched components and a matched circuit topology to obtain matched first and third currents. The DC-DC converter further comprises a controller which has a control input for receiving a voltage generated by the third current to control the DC-DC converter to supply a second current such that a minimal DC-component of the first current supplied by the linear amplifier is obtained and the losses in the linear amplifier are minimized.

The claimed power supply system generates a copy of the output current of the linear amplifier to obtain a control signal for the DC-DC converter. Thus, the resistor in the output of the linear amplifier is not required anymore, and the power loss in the resistor is absent.

In the prior art topology, a low value of the resistor could be selected. However, a low value of the resistor increases the sensitivity to offset and noise of the electronics which senses the voltage drop across the resistor. Also, the parasitic inductance in series with the resistor cannot be neglected for high frequencies. For example, at a practical value of the resistor of 0.01 ohms and 10 nH series inductance a zero is created at 160 kHz which limits the frequency range wherein the DC-DC converter is active and thus increases the inefficiency of the power supply system.

The prior art current sensing resistor is connected at one end to the load. Thus, the output voltage across the load is a common-mode signal for the current sensing electronics. This common mode signal has a magnitude which is much higher than the magnitude of the differential mode control signal. Therefore, the sensing electronics need to have a high common-mode rejection, even at high frequencies which is not easy to accomplish. Further, the sensing resistor deteriorates the feedback loop stability.

It has to be noted that in applications wherein the output voltage across the load has to vary rapidly and the dissipation in the linear amplifier should be minimal, the switching frequency of the DC-DC converter has to be selected relatively high. Only then, the majority of the power to be supplied to the load is actually supplied by the DC-DC converter. The linear amplifier only supplies current to the load during a short period in time during which the voltage across the load has to change more rapidly than the DC-DC converter is able to supply the current required by the load. In a practical application such as a handheld mobile telephone, the switching frequency of the DC-DC converter may be selected in the order of 10 MHz.

In an embodiment as claimed in claim 2, the power supply system further comprises a resistor which is arranged between an output of the second amplifier stage and a reference voltage. The third current flows through this resistor. The control input is a differential input which receives the voltage across the resistor due to the third current. Thus, the third current supplied by the second amplifier stage provides a control voltage across the resistor which is used to control the DC-DC converter. Preferably, the control of the DC-DC converter is performed in a same manner as in the prior art.

In an embodiment as claimed in claim 3, the second amplifier stage has two outputs to supply two identical currents with a 180 degrees phase shift. The power supply system further comprises a resistor arranged between the two outputs of the second amplifier stage. The third current flows through the resistor, and the control input is a differential input for receiving the voltage across the resistor. In fact, now the second amplifier stage circulates the third current through the resistor to obtain the control voltage for the DC-DC converter.

In an embodiment as claimed in claim 4, the controller comprises at least an integrating action. The controller may also comprise a proportional and/or differentiating action. A controller which has a proportional action is commonly referred to as a P-controller. A controller which has an integrating action is commonly referred to as an I-controller, and a controller which has a differentiating action is commonly referred to as a D-controller. A controller which has all three actions is referred to as a PID-controller. Other combinations are also possible.

In an embodiment as claimed in claim 5, a capacitor is arranged between the output of the second amplifier stage and a reference voltage. Now, the third current is flowing through the capacitor. The control input is coupled to the capacitor to use the voltage on the capacitor to control the DC-DC converter. This has the advantage that the controller can be simplified because the integrating action is now performed by the capacitor.

In an embodiment as claimed in claim 6, the second amplifier stage has two outputs to supply two identical currents with a 180 degrees phase shift. The power supply system further comprises a capacitor arranged between the two outputs of the second amplifier stage. The third current flows through the capacitor, and the control input is a differential input for receiving the voltage across the capacitor. In fact, now the second amplifier stage circulates the third current through the capacitor to obtain the control voltage for the DC-DC converter.

In an embodiment as claimed in claim 7, a capacitor is arranged as a Miller capacitance between the input and the inverting output of the second amplifier stage. The control input is coupled to the output of the second amplifier stage. Again, this has the advantage that the controller can be simplified because the integrating action is now performed by the capacitor.

In an embodiment as claimed in claim 9, the linear amplifier comprises a differential input stage having a non-inverting input for receiving a reference signal and an inverting input for receiving a voltage proportional to the system output voltage across the load, preferably such that the closed loop gain is unity or higher than 1. An output of the differential input stage is coupled to both an input of the first amplifier stage and an input of the second amplifier stage. Due to this negative feedback loop, the reference signal determines the system output voltage.

In an embodiment as claimed in claim 10, a low pass filter is arranged in-between the converter output and the load. This low pass filter decreases the ripple of the DC-DC converter at the system output.

In an embodiment as claimed in claim 13, the first amplifier stage is an inverting amplifier. The linear amplifier comprises a Miller capacitor which is arranged between the input and the output of the first amplifier stage. This Miller capacitor improves the stability of the negative feedback loop obtained by feeding back the (tapped-in) output voltage.

In an embodiment as claimed in claim 14, the differential input stage comprises a series arrangement of a non-inverting differential stage and an inverting amplifier. The non-inverting differential stage has a non-inverting input to receive the reference signal, and an inverting input to receive the voltage proportional to the system output voltage across the load. The output of the non-inverting differential stage is coupled to the input of the first amplifier stage via the inverting amplifier. A Miller capacitor is arranged between the output of the non-inverting differential stage and the input of the first amplifier stage. Again, this Miller capacitor improves the stability of the negative feedback loop obtained by feeding back the (tapped-in) output voltage.

These and other aspects of the invention are apparent from and will be elucidated with reference to the embodiments described hereinafter.

DETAILED DESCRIPTION

It should be noted that items which have the same reference numbers in different Figures, have the same structural features and the same functions, or are the same signals. Where the function and/or structure of such an item has been explained, there is no necessity for repeated explanation thereof in the detailed description.

Figure 1:
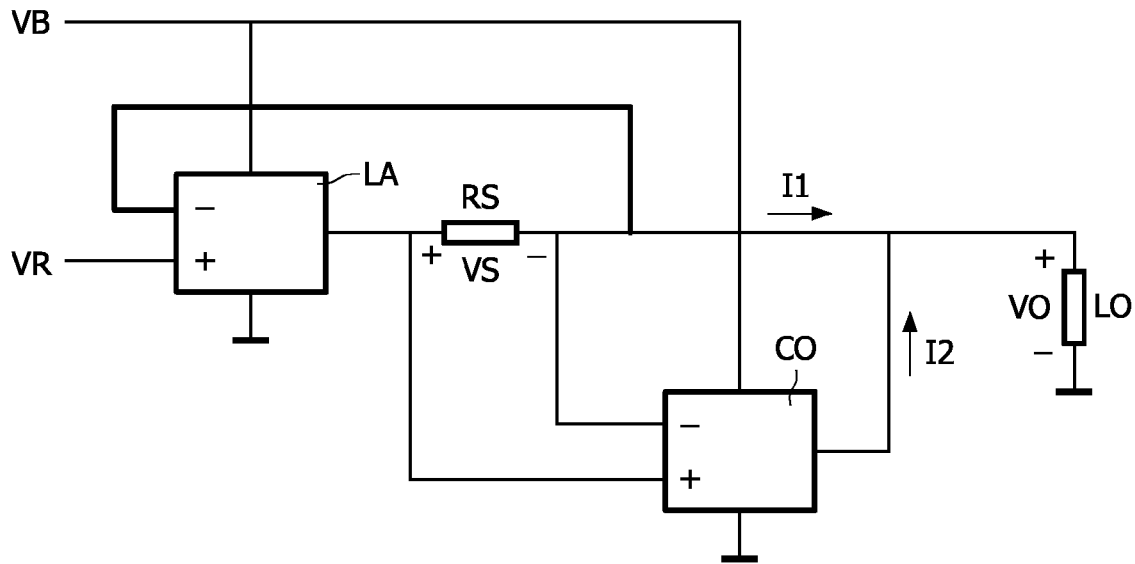
FIG. 1 shows a block diagram of a prior art power supply system which comprises a parallel arrangement of a linear amplifier and a DC-DC converter.

FIG. 1 shows a block diagram of a prior art power supply system which comprises a parallel arrangement of a linear amplifier and a DC-DC converter. In systems, such as, for example, a mobile telephone wherein the output power of a power amplifier changes rapidly, it is advantageous to modulate the supply voltage of the power amplifier. An improved efficiency and thus a longer time a single battery charge can supply the mobile telephone is obtained if the supply voltage changes rapidly to closely match the rapidly changing output power variations. As disclosed in U.S. Pat. No. 5,905,407 it is known to generate such a rapidly varying supply voltage with a power supply system which comprises a parallel arrangement of a linear amplifier LA and a DC-DC converter CO. This arrangement is referred to as a parallel arrangement because the supply inputs of the linear amplifier LA and the DC-DC converter CO are interconnected to receive the same supply voltage VB, and because the linear amplifier LA and the DC-DC converter CO both supply their output current to the same load LO.

The linear amplifier LA has a non-inverting input to receive a reference voltage VR, an inverting input to receive the output voltage VO across the load LO, and an output which is connected to the load via a sense resistor RS. A variation of the reference voltage VR should be followed as close as possible by the output voltage VO. The output current I1 of the linear amplifier LA flows through the sense resistor RS to the load LO. The sense voltage VS across the sense resistor RS is sensed by the differential input of the DC-DC converter CO to control the output current I2 of the DC-DC converter such that the DC component of the current I1 supplied by the linear amplifier LA is minimized.

The output voltage VO across the load LO is determined by the sum of the currents I1 and I2. The negative feedback loop formed by feeding back the output voltage VO to the inverting input of the linear amplifier LA causes the linear amplifier LA to supply a current I1 which supplements the current I2 such that the output voltage VO closely tracks the reference voltage VR even if the DC-DC converter CO is unable to react sufficiently fast. Alternatively, the output voltage of the linear amplifier LA itself may be fed back to its inverting input.

Such a power supply system has the advantage that the DC and low frequent portion of the current required by the load LO is supplied by the relatively power-efficient but relatively slow DC-DC converter CO. The remaining small high frequent portion of the current is supplemented by the relatively fast but relatively power-inefficient linear amplifier LA.

Figure 2:
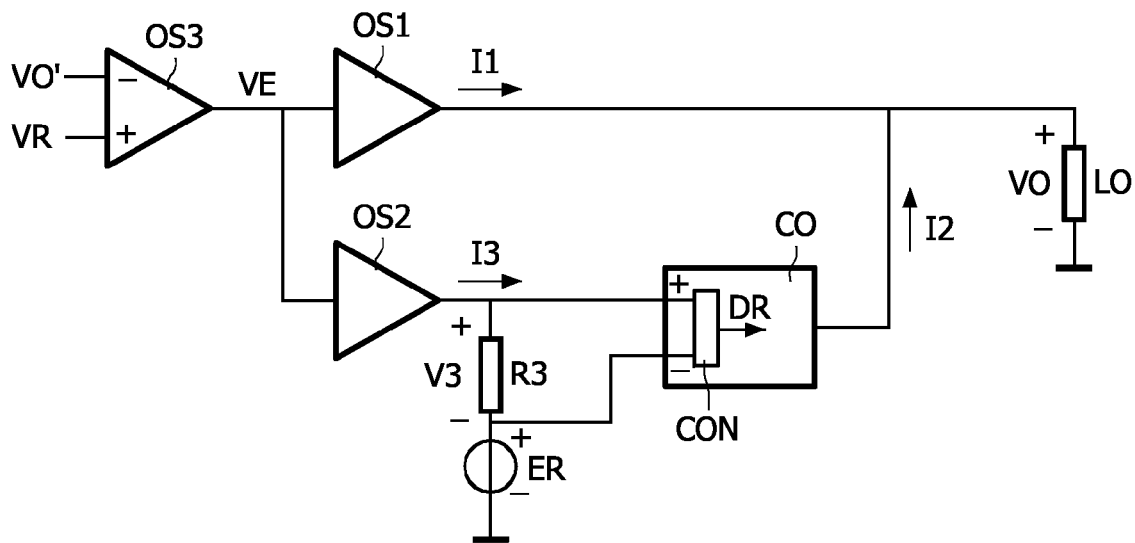
FIG. 2 shows a block diagram of an embodiment of the power supply system in accordance with the invention in which the linear amplifier has an output which supplies current to the load and a further output which supplies a current proportional to the current supplied to the load as a control current to the DC-DC converter.

FIG. 2 shows a block diagram of an embodiment of the power supply system in accordance with the invention in which the linear amplifier has an output which supplies current to the load and a further output which supplies a current proportional to the output current of the linear amplifier supplied to the load as a control current to the DC-DC converter.

The linear amplifier LA comprises a differential input stage OS3 and two amplifier stages OS1 and OS2. The differential input stage OS3 has an inverting input to receive a voltage VO' proportional to the output voltage VO developed across the load LO, a non-inverting input to receive the reference voltage VR, and an output to supply the error signal VE. The amplifier stage OS1 has an input to receive the error signal VE, and an output to supply the current I1 directly to the load LO. Thus, the sense resistor shown in FIG. 1 is not present anymore and the output of the amplifier stage OS1 is directly connected to the load LO. Consequently, the drawbacks of the sense resistor are avoided. In the prior art, instead of the sense resistor another current sensing element or circuit may be used such as a current transformer. However the insertion of these sensing elements in the output of the amplifier stage OS1 has negative effects similar to that of the sense resistor.

The amplifier stage OS2 has been added to generate the control signal for the DC-DC converter CO. The amplifier stage OS2 has a transconductance which is proportional to the transconductance of amplifier stage OS1, an input to receive the error signal VE, and an output to supply the current I3. The elements of the amplifier stages OS1 and OS2 are matched to obtain currents I1 and I3 which are identical or proportional to each other.

The DC-DC converter CO comprises a controller CON which has an inverting input and a non-inverting input to differentially sense an input voltage and to supply a control signal DR to the switch or switches (not shown) of the DC-DC converter CO to obtain an output current I2 of the DC-DC converter CO such that the average current I1 supplied by the linear amplifier LA is substantially zero. The output current I2 of the DC-DC converter CO is supplied to the load LO. The DC-DC converter may be any type of DC-DC converter. DC-DC converters as such are well known to the skilled person and are therefore not further detailed.

The power supply system further comprises a series arrangement of the resistor R3 and a reference voltage source ER. This series arrangement is arranged between the output of the amplifier stage OS2 and ground. The resistor R3 is arranged between the inverting and non-inverting inputs of the controller CON. Thus, the current I3 flows through the resistor R3 to obtain a voltage V3 across the resistor R3. This voltage V3 is the input voltage of the controller CON which controls the switch or switches of the DC-DC converter CO accordingly. The control of the switch or switches of a DC-DC converter as such is well known from prior art, such as for example, U.S. Pat. Nos. 5,905,407, 6,130,525, 6,130,526, 6,583,664, and 6,661,210. Thus, the DC-DC converter CO may be a hysteretic controlled converter, or may have a fixed switching frequency, but other types of converters may be used as well.

The reference voltage source ER minimizes the common mode signal at the differential input of the controller CON, thus the requirements on the controller CON with respect to common mode rejection are considerably relaxed with respect to the prior art construction shown in FIG. 1.

The resistor R3 may in fact be considered to be a scaled version of the sense resistor RS shown in FIG. 1, thus: R3=m*RS, wherein m is a scaling factor, preferably larger than one. In the now following, by way of example, it is assumed that the design of the amplifier stages OS1 and OS2 is such that current I1 is a factor n larger than current I3. If m=n, the DC-DC converter CO receives the same differential input signal both in the prior art configuration shown in FIG. 1 and in the embodiment in accordance with the present invention shown in FIG. 2. If m>n then the voltage V3 is larger than the voltage VS and the sensitivity to offset and noise of the differential input stage of the controller CON is reduced. The influence of the parasitic inductance in series with the resistor RS is considerably reduced because R3>RS. Further, the power losses in the resistor R3 are much lower than in RS.

Figure 3:
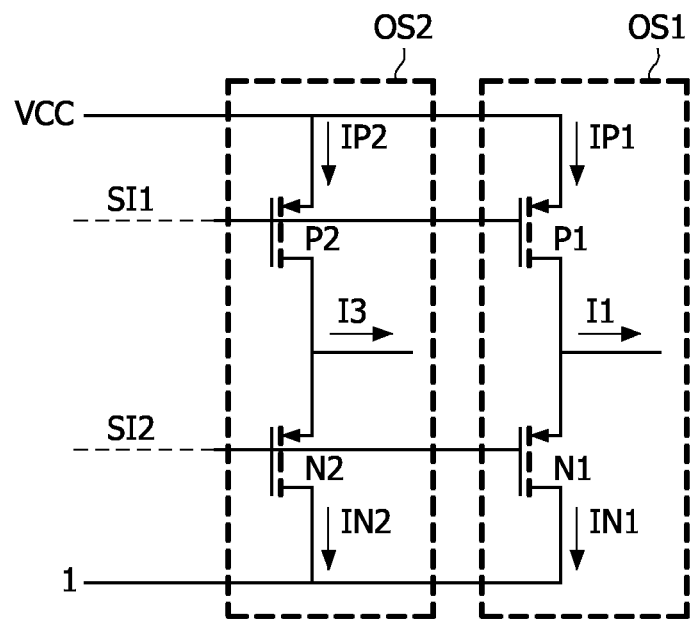
FIG. 3 shows a circuit diagram of an embodiment of the linear amplifier generating two output currents.

FIG. 3 shows a circuit diagram of an embodiment of the linear amplifier generating two output currents. The amplifier stage OS1 comprises a common-source output stage with a series arrangement of a P-channel FET P1 and an N-channel FET N1 arranged in the well known common source configuration wherein the drains are interconnected while the sources are arranged to receive the supply voltage VCC. The amplifier stage OS2 comprises a common-source output stage with a series arrangement of a P-channel FET P2 and an N-channel FET N2 also arranged in the well known common source configuration wherein the drains are interconnected while the sources are coupled to receive the supply voltage VCC. These common source output stages are able to provide a large (inverting) voltage gain and a large current gain as well. A common drain stage may succeed the common source stage to add additional current gain.

The gates of the FET's P1 and P2 are interconnected and receive the input voltage SI1 to obtain respective drain currents IP1 and IP2. The gates of the FET's N1 and N2 are interconnected and receive the input voltage SI2 to obtain respective drain currents IN1 and IN2. The output current I1 of the amplifier stage OS1 is the difference between the currents IP1 and IN1. The output current I3 of the amplifier stage OS2 is the difference between the currents IP2 and IN2. By matching the transistors P1 and P2, and N1 and N2, the currents I1 and I3 are identical or scaled copies dependent on the dimensions of the transistors. If for example, the transistors P1 and N1 are n times larger than the respective transistors P2 and N2, the current I3 is n times smaller than the current I1. Such transistor and circuit matching techniques to obtain a current which is proportional to another current are as such well known in the art.

Figure 4:
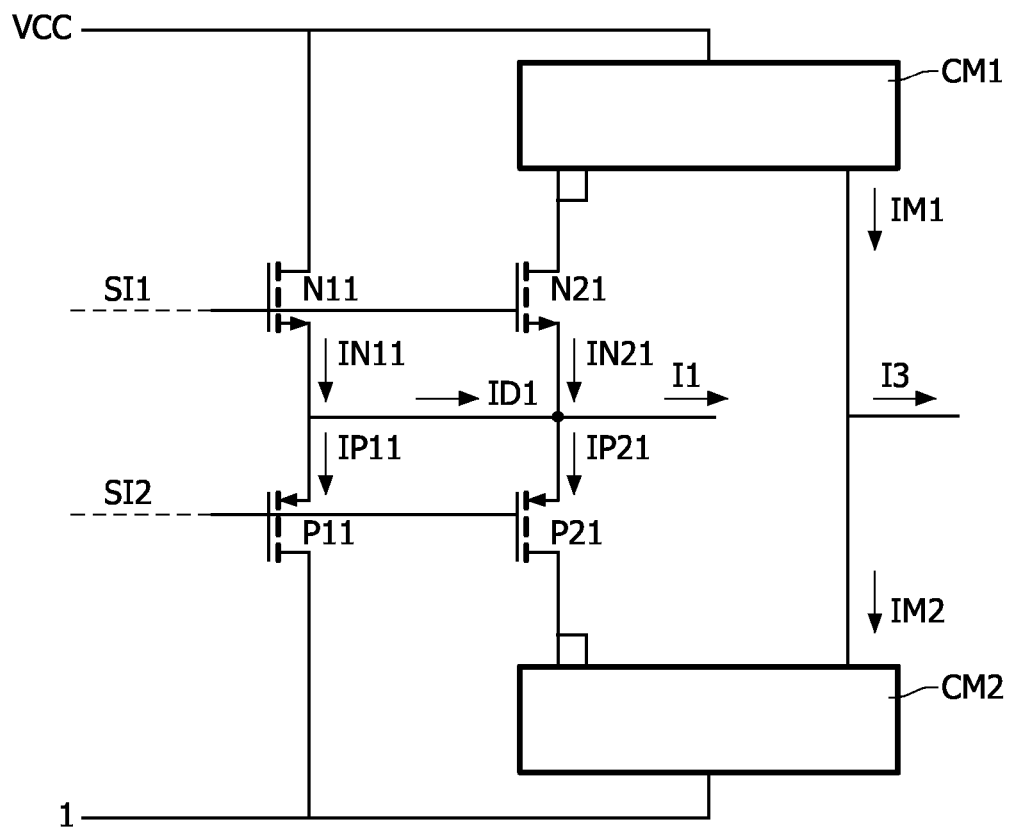
FIG. 4 shows a circuit diagram of another embodiment of the linear amplifier generating two output currents.

FIG. 4 shows a circuit diagram of another embodiment of the linear amplifier generating two output currents. A first common drain output stage comprises a series arrangement of the N channel FET N11 and the P channel FET P11 of which the sources are interconnected and the drains are arranged to receive the supply voltage VCC. A second common drain output stage comprises a series arrangement of the N channel FET N21 and the P channel FET P21 of which the sources are interconnected and the drains are arranged to receive the supply voltage VCC via the input branches of two current mirrors CM1 and CM2. The gates of the FET's N11 and N21 are interconnected and receive the input voltage SI1 to obtain respective drain currents IN11 and IN21. The gates of the FET's P11 and P21 are interconnected and receive the input voltage SI2 to obtain respective drain currents IP11 and IP21. The output current ID11 of the first common drain output stage is the difference between the currents IN11 and IP11. The output current of the second common drain output stage is the difference between the currents IN21 and IP21.

The sources of the first and second common drain output stages are interconnected and thus, the output current I1 of the combination of these two output stages is the sum of the output current ID1 and the output current of the second common drain output stage. This output current I1 is directly supplied to the load LO. The output current I3 which is supplied to the control input of the DC-DC converter CO is obtained by mirroring the current IN21 with the current mirror CM1 to obtain the current IM1, and by mirroring the current IP21 with the current mirror CM2 to obtain the current IM2, and by subtracting the currents IM1 and IM2 at a common node.

By matching the transistors P11 and P21, and N11 and N21, the currents I1 and I3 are identical or scaled copies dependent on the dimensions of the transistors. If for example, the transistors P11 and N11 are n−1 times larger than the respective transistors P21 and N21, and the current mirrors have a mirroring ratio of one, the current I3 is n times smaller than the current I1.

In the circuits shown in FIGS. 3 and 4 it is assumed that the MOS-FET's are biased in saturation and that the Early effect can be neglected. Alternative, more complex configurations which avoid the effects of non-equal drain-source voltages are as such well known. With a larger transistor is meant a transistor which has a larger gate width and/or which comprises a parallel arrangement of several transistors to enlarge the effective gate width.

Figure 5:
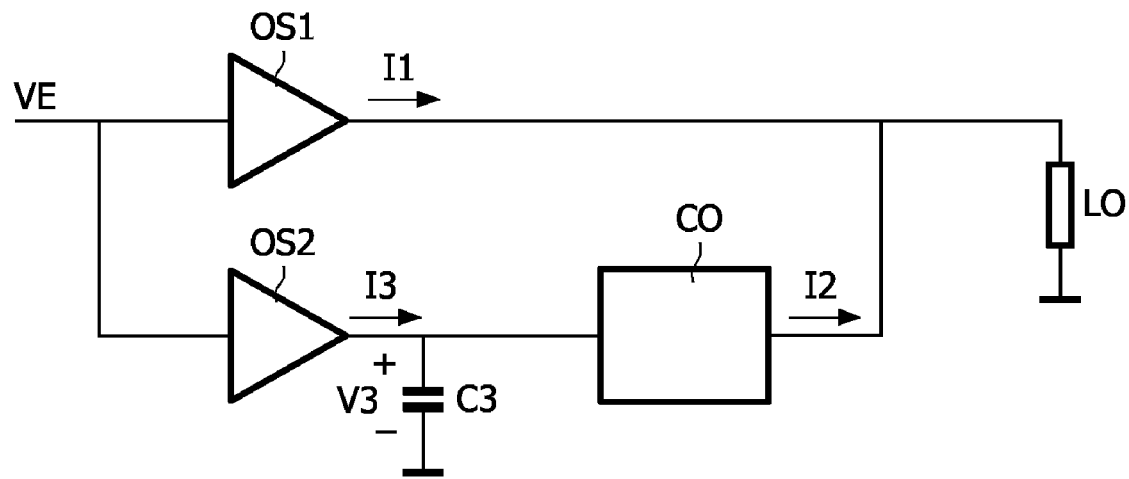
FIG. 5 shows a block diagram of an embodiment of the power supply system in accordance with the invention.

FIG. 5 shows a block diagram of an embodiment of the power supply system in accordance with the invention. The amplifier stage OS1 receives the error voltage VE (see FIG. 2) and supplies the current I1 directly to the load LO. The amplifier stage OS2 receives the error voltage VE and supplies the current I3 which is proportional to the current I1 to the capacitor C3 to obtain a voltage V3 across it. The control input of the DC-DC converter CO receives the voltage V3 to control the DC-DC converter CO to supply the appropriate current I2 to the load LO.

The DC-DC converter CO comprises a controller CON (see FIG. 2) which controls a switching stage (not shown). Usually, the controller CON has a high low-frequency gain, often obtained by using an integrator. The combination, shown in FIG. 2, of the resistor R3 and the output amplifier stage OS2 which supplies the current I3 to the resistor R3, has a frequency-independent gain. Usually the controller CON of FIG. 2 requires an integrator. This integrator of FIG. 2 can be omitted if the resistor R3 is replaced by the capacitor C3 as shown in FIG. 5. The capacitor C3 now performs the integrating action on top of converting the current I3 into a voltage V3 suitable for the controller CON.

Figure 6:
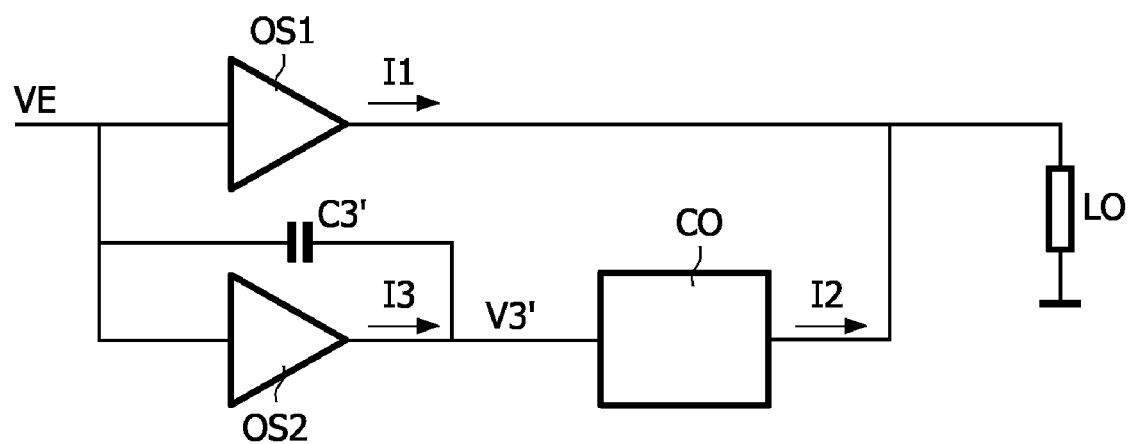
FIG. 6 shows a block diagram of another embodiment of the power supply system in accordance with the invention.

FIG. 6 shows a block diagram of another embodiment of the power supply system in accordance with the invention. The block diagram of FIG. 6 differs from the block diagram of FIG. 5 in that the capacitor C3 is replaced by a Miller capacitor C3' which is arranged between the input and the inverting output of the amplifier stage OS2. Now, the voltage V3' at the output of the amplifier stage OS2 and thus at the control input of the DC-DC converter CO is the sum of the error voltage VE and the voltage across the capacitor C3' caused by the current I3 flowing there through. Again, due to the integration action performed by the capacitor C3', the controller CON does not need to perform an integrating action.

The crossover frequency fx of the contributions to the load current of the DC-DC converter CO and the linear amplifier LA is defined by the equation $$fx = (gcon/(2\pi * C3'))*(I3/I1)$$

wherein gcon is the effective voltage to current conversion of the DC-DC converter CO, C3' is the Miller capacitance, and I3/I1 is the ratio of output currents of OS2 and OS1, substantially determined by the layout dimensions of the amplifier stages OS2 and OS1, respectively. It has to be noted that the crossover frequency fx is determined by a few parameters only, which greatly simplifies fixing the crossover frequency fx to a desired value.

Figure 7:
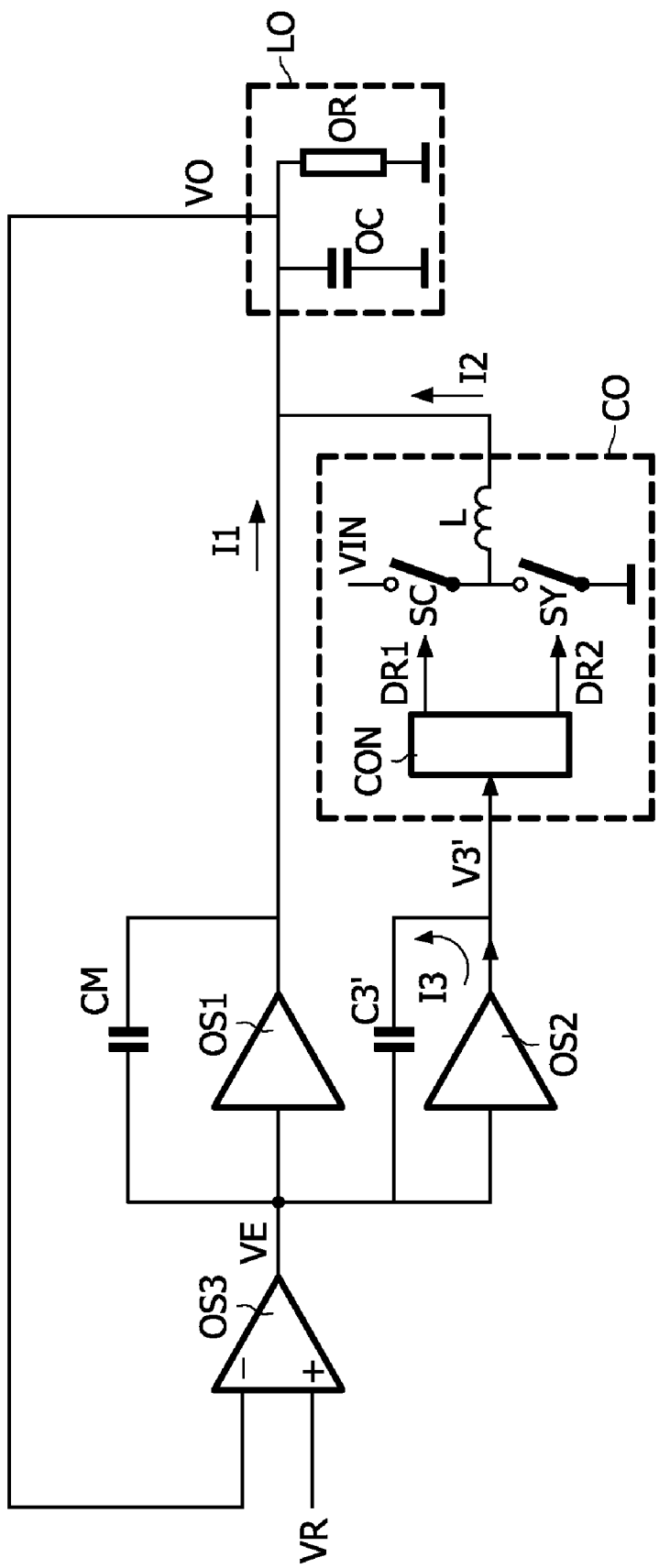
FIG. 7 shows a block diagram of yet another embodiment of the power supply system in accordance with the invention.

FIG. 7 shows a block diagram of yet another embodiment of the power supply system in accordance with the invention.

The linear amplifier LA comprises the differential input stage OS3 and two amplifier stages OS1 and OS2. The differential input stage OS3 has an inverting input to receive a voltage proportional to the output voltage VO developed across the load LO, a non-inverting input to receive the reference voltage VR, and an output to supply the error signal VE. The amplifier stage OS1 has an input to receive the error signal VE, and an output to supply the current I1 directly to the load LO. Thus, the sense resistor shown in FIG. 1 is not present anymore and the output of the amplifier stage OS1 is directly connected to the load LO. The amplifier stage OS2 has been added to generate the control signal for the DC-DC converter CO. The amplifier stage OS2 has an input to receive the error signal VE, and an output to supply the current I3 proportional to the output current I1. The elements of the amplifier stages OS1 and OS2 are matched to obtain currents I1 and I3 which are identical or which are scaled copies. A Miller capacitor C3' between the input and the inverting output of OS2 integrates the current I3 to obtain a control voltage V3' at the output of the amplifier stage OS2.

The DC-DC converter CO comprises a controller CON which has an input to sense the control voltage V3' and outputs to supply the control signals DR1 and DR2 to the switches SC and SY of the DC-DC converter CO to obtain an output current I2 of the DC-DC converter CO such that the average of the current I1 supplied by the linear amplifier is substantially zero. The switches SC and SY are arranged in series to receive a DC-input voltage VIN. An inductor L is coupled between the junction of the two switches SC and SY and the load LO. The current I2 generated through the inductor L is fed to the load LO which comprises a parallel arrangement of a smoothing capacitor OC and a load-impedance OR which represents the apparatus or circuits to which the power has to be supplied. The voltage VO across the load LO is also referred to as the output voltage of the power supply system.

Usually, the switch SC is referred to as the control switch and the switch SY is referred to as the synchronous switch. The inductor L may be a coil or a transformer. It has to be noted that the DC-DC buck converter shown is an example only, the present invention can also be used in combination with other DC-DC converters.

A Miller capacitor CM is arranged between the input and the inverting output of the amplifier stage OS1 to provide Miller frequency compensation. This pole-splitting or Miller frequency compensation as such is well known. If the Miller capacitor CM is not present, the transfer function of the two series arranged amplifiers OS3 and OS1 has two poles. Due to the two poles, the negative feedback of the output voltage VO to the input of the amplifier OS3 may cause an oscillation. The addition of the Miller capacitor CM provides a first order fall off and a unity gain which is determined by two parameters only: the transconductance of the amplifier OS3 and the value of the Miller capacitor CM.

Because the branch with the DC-DC converter provides the DC and low-frequent component of the current to the load LO, and the linear amplifier LA the high frequent component of the current to the load, the stability of the feedback is predominantly determined by the branch which comprises the amplifiers OS3 and OS1. The power supply system shown is a hybrid circuit which comprises a linear amplifier LA and a DC-DC converter CO in which feed-forward control, Miller frequency compensation, and overall negative feedback is implemented. The feed-forward control is obtained by the currents I1 and I2 generated by the linear amplifier LA and a DC-DC converter CO, respectively. The overall negative feedback is obtained by subtracting a voltage proportional to the output voltage VO from the reference voltage VR in the differential input stage OS3. The unity voltage gain frequency of the topology shown is approximated by the equation $$f1 = gin/(2\pi * CM)$$

wherein gin is the effective transconductance of the differential input stage OS3, and CM is the Miller capacitor arranged between the input and the inverting output of the amplifier stage OS1. This approximation is valid if the transconductance gain g1 of the amplifier stage OS1 is much larger than the conductance of the load LO.

Figure 8:
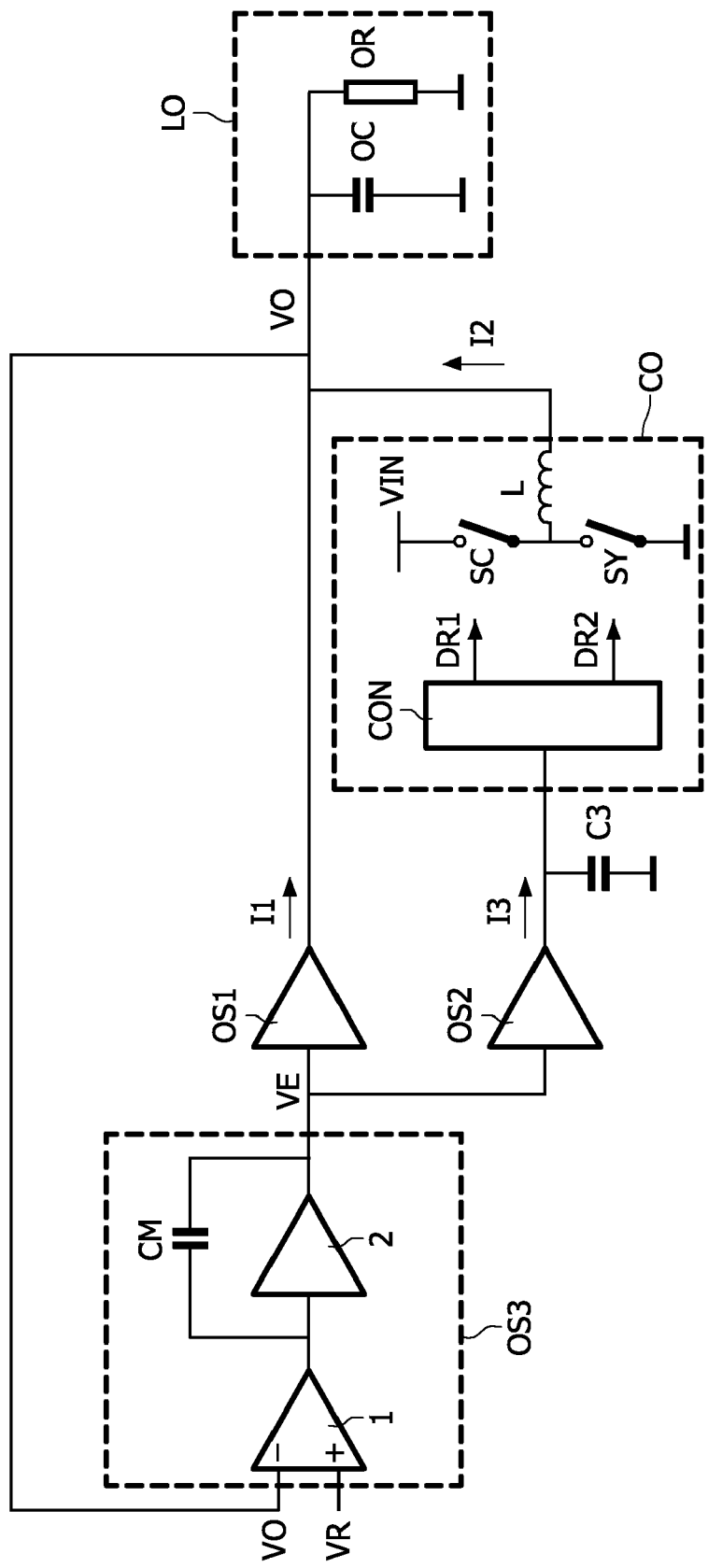
FIG. 8 shows a block diagram of yet another embodiment of the power supply system in accordance with the invention.

Alternatively, the Miller capacitor C3' may be replaced by the resistor R3 and reference voltage source ER shown in FIG. 2, or the amplifier stage OS2 may have differential outputs which generate a voltage across a resistor which voltage is used by the controller CON (see FIG. 8). However, then, usually, the controller CON has to comprise an integrating action.

A low pass filter may be arranged between the output of the DC-DC converter CO and the load to decrease the ripple produced by the DC-DC converter CO. Preferably, the −3 dB bandwidth of this filter is selected at a frequency higher than the crossover frequency fx mentioned hereinbefore, and below the switching frequency of the DC-DC converter CO.

FIG. 8 shows a block diagram of yet another embodiment of the power supply system in accordance with the invention. This embodiment is based on the embodiment shown in FIG. 7. In FIG. 7, both the amplifier OS2 and OS1 are inverting amplifiers which preferable comprise the output stages shown in FIG. 3. In FIG. 8, both the amplifier OS2 and OS1 are non-inverting amplifiers which preferably comprise the output stages shown in FIG. 4. The non-inverting amplifier OS3 comprises a first inverting amplifier 1 which has inputs to receive the reference voltage VR and the output voltage VO or a tapped-in output voltage VO, and which has an output connected to an input of a second inverting amplifier 2. The output of the inverting amplifier 2 supplies the error voltage VE. Now, the Miller capacitor CM is arranged internally in the amplifier OS3 between the input and the output of the amplifier 2.

Another difference with the circuit shown in FIG. 7 is that the Miller capacitor C3' has been omitted and the integrating capacitor C3 of FIG. 5 has been added.

Figure 9:
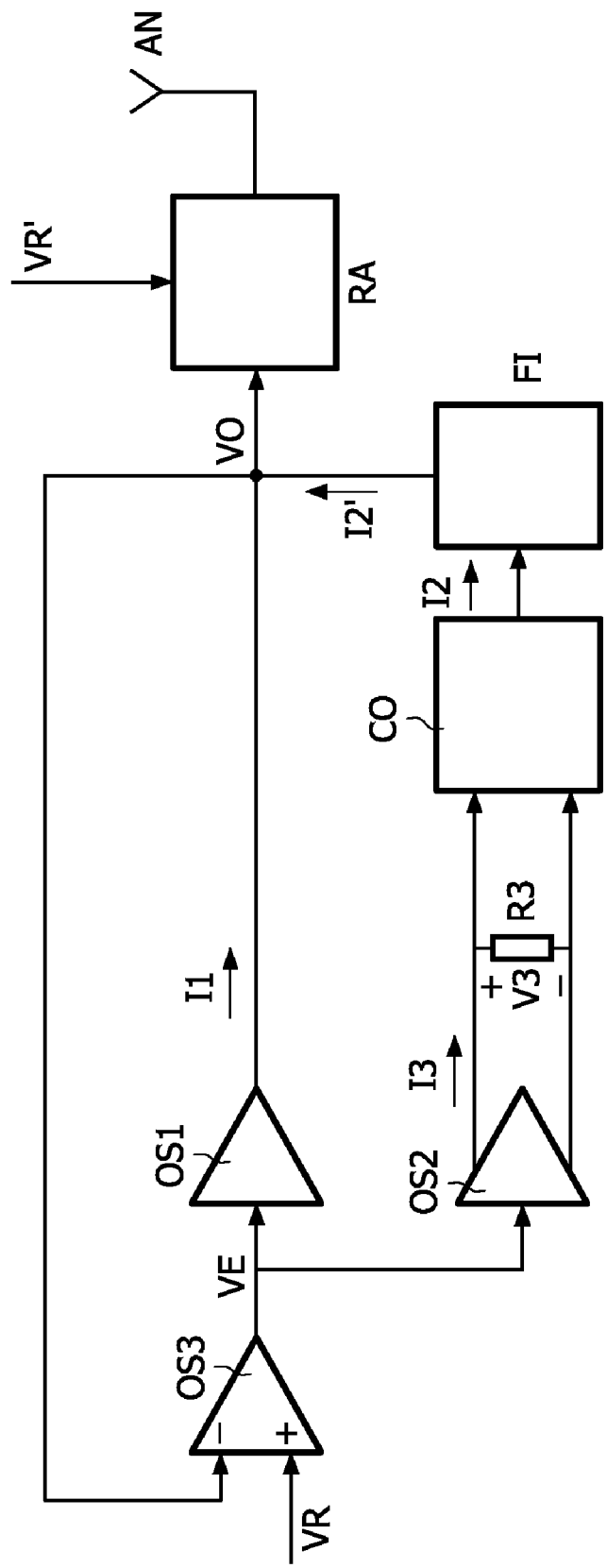
FIG. 9 shows a block diagram of a telecom system comprising the power supply system in accordance with the invention.

FIG. 9 shows a block diagram of a telecom system comprising the power supply system in accordance with the invention. A power efficient RF power amplifier RA for use in, for example, 2.5G, 3G, or 4G telecom systems requires a fast and power efficient supply modulator. This supply modulator or power supply system supplies a rapidly varying supply voltage VO to the RF power amplifier RA. This supply voltage VO fits the output power to be supplied by the RF power amplifier RA. A fast and accurate control of the supply voltage VO, and thus of the current supplied by the power supply system, is especially important in handheld battery operated communication devices, such as, for example, mobile phones, to maximize the time a single battery charge can supply the system. The level of the supply voltage VO is only high during periods in time wherein a high output power is required. Thus, as soon as a lower output power is possible, the level of the supply voltage VO should be rapidly decreased to optimally fit the lower output power.

The power supply system comprises a linear amplifier LA and a DC-DC converter CO. The linear amplifier LA comprises the differential input stage OS3 and the amplifier stages OS1 and OS2. The differential input stage OS3 has an inverting input to receive a voltage proportional to the output voltage VO, a non-inverting input to receive the reference voltage VR, and an output to supply the error signal VE. The amplifier stage OS1 has an input to receive the error signal VE and an output to supply the output current I1 of the linear amplifier LA directly to the load which now comprises the RF power amplifier RA. The amplifier stage OS2 has an input to receive the error voltage VE, a differential output pair to obtain a current I3 through a resistor R3 arranged between the differential output pair. The current I3 causes a voltage V3 across the resistor R3. The controller (not shown) of the DC-DC converter CO uses the voltage V3 to control the switches of the DC-DC converter to obtain the output current I2 of the DC-DC converter 15 CO. An optional low pass filter FI filters the output current I2 to obtain the filtered current I2' which is supplied to the load. The filter FI decreases the ripple of the DC-DC converter CO. In some embodiments, the resistor R3 is replaced with a capacitor (e.g., C3 as shown in FIG. 5 and discussed above), with the third current being that through the capacitor.

Another reference voltage VR' is fed to the RF power amplifier RA. Usually the reference voltage VR only comprises amplitude information while the reference voltage VR' comprises phase information and may comprise amplitude information. Thus, if output power of the RF amplifier has to rapidly increase, the control signal VR commands the power supply system to increase the currents I1 and I2. The relatively slow DC-DC converter CO cannot immediately follow a fast step of the reference signal VR. The difference between the required current to the load and the current I2 or I2' supplied by the DC-DC converter CO will be supplied as the current I1 by the linear amplifier. Once a stable situation is reached, the DC and low frequency part of the current required by the RF power amplifier RA is delivered by the DC-DC converter CO, and the current I1 adds the high frequency part of the current required by the RF power amplifier RA and subtracts (part of) the inherent ripple of the DC-DC converter CO.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A power supply system comprising:
   a parallel arrangement of a linear amplifier and a DC-DC converter,
   an output of the linear amplifier being directly coupled to a load for supplying a first current to the load,
   the DC-DC converter having a converter output coupled to the load for supplying a second current to the load,
   the linear amplifier including a first amplifier stage for supplying the first current, and a second amplifier stage for generating a third current being proportional to the first current, the first amplifier stage and the second amplifier stage having matched components, and
   the DC-DC converter further including a controller having a control input for receiving a voltage generated by the third current to control the second current for minimizing a DC-component of the first current.

2. A power supply system as claimed in claim 1, wherein the second amplifier stage supplies the third current, and wherein the power supply system further comprises a resistor for receiving the third current and being arranged between an output of the second amplifier stage and a reference voltage, and wherein the control input is a differential input for receiving a voltage across the resistor.

3. A power supply system as claimed in claim 1, wherein the second amplifier stage has two outputs for supplying two identical currents having 180 degrees phase shift, and wherein the power supply system further comprises a resistor arranged between the two outputs of the second amplifier stage for obtaining the third current through the resistor, and wherein the control input is a differential input for receiving a voltage across the resistor.

4. A power supply system as claimed in claim 1, wherein the controller comprises at least an integrating action.

5. A power supply system as claimed in claim 1, further comprising a capacitor for receiving the third current and being arranged between an output of the second amplifier stage and a reference voltage, and wherein the control input is coupled to the capacitor for receiving a voltage on the capacitor.

6. A power supply system as claimed in claim 1, wherein the second amplifier stage has two outputs for supplying two identical currents having 180 degrees phase shift, and wherein the power supply system further comprises a capacitor arranged between the two outputs of the second amplifier stage obtaining the third current through the capacitor, and wherein the control input is a differential input for receiving a voltage across the capacitor.

7. A power supply system as claimed in claim 1, further comprising a capacitor arranged as a Miller-capacitance between an input and an inverting output of the second amplifier stage, and wherein the control input is coupled to the output of the second amplifier stage.

8. A power supply system as claimed in claim 5, wherein the controller comprises only a proportional and/or differentiating function.

9. A power supply system as claimed in claim 1, wherein the linear amplifier comprises a differential input stage having a non-inverting input for receiving a reference signal and an inverting input for receiving a voltage proportional to the system output voltage across the load an output of the differential input stage being coupled to both an input of the first amplifier stage and an input of the second amplifier stage, an output of the first amplifier stage being coupled for supplying the first current.

10. A power supply system as claimed in claim 1, wherein a low pass filter is arranged in-between the converter output and the load.

11. A power supply system as claimed in claim 1, wherein the first amplifier stage and the second amplifier stage comprise a first common-source stage and a second common-source stage respectively, having matched transistors and currents.

12. A power supply system as claimed in claim 1, wherein the first amplifier stage and the second amplifier stage comprise a first common-drain stage and a second common-drain stage respectively, having matched transistors and currents.

13. A power supply system as claimed in claim 9, wherein the first amplifier stage is an inverting amplifier, and wherein the linear amplifier further comprises a Miller capacitor arranged between the input and the output of the first amplifier stage.

14. A power supply system as claimed in claim 9, wherein the differential input stage comprises: an inverting amplifier, a non-inverting differential stage having a non-inverting input for receiving the reference signal and an inverting input for receiving the voltage proportional to the system output voltage across the load, and an output being coupled to the input of the first amplifier stage via the inverting amplifier, and a Miller capacitance arranged between the output of the non-inverting differential stage and the input of the first amplifier stage.

15. A power supply system as claimed in claim 1, further including the load.

16. A telecom system comprising:
   an RF amplifier load circuit;
   a linear amplifier including
      a first amplifier stage having an output directly coupled to the load circuit for supplying a first current to the load circuit,
      a second amplifier stage configured to generate a second current that is proportional to the first current; and
   a DC-DC converter in parallel with the linear amplifier, the converter including
      a control input configured to receive a voltage generated by the second current, and
      a controller configured to supply current to the load, based upon the voltage generated by the second current, for minimizing a DC-component of the first current.

* * * * *